US011424739B2

(12) United States Patent
Avestruz et al.

(10) Patent No.: US 11,424,739 B2
(45) Date of Patent: Aug. 23, 2022

(54) FEEDBACK-BASED TRANSISTOR DRIVER

(71) Applicant: The Regents of the University of Michigan, Ann Arbor, MI (US)

(72) Inventors: Al-Thaddeus Avestruz, Ann Arbor, MI (US); Xin Zan, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 17/335,838

(22) Filed: Jun. 1, 2021

(65) Prior Publication Data
US 2021/0376828 A1    Dec. 2, 2021

Related U.S. Application Data

(60) Provisional application No. 63/032,804, filed on Jun. 1, 2020.

(51) Int. Cl.
*H03K 17/687* (2006.01)
*H03K 17/691* (2006.01)
*H02M 3/335* (2006.01)

(52) U.S. Cl.
CPC ................... *H03K 17/687* (2013.01)

(58) Field of Classification Search
None
See application file for complete search history.

(56) References Cited

U.S. PATENT DOCUMENTS

| | | | | |
|---|---|---|---|---|
| 3,805,094 A | * | 4/1974 | Orlando | H03K 17/04126 327/482 |
| 4,308,577 A | * | 12/1981 | Mentler | H02M 7/538 323/289 |
| 4,423,341 A | * | 12/1983 | Shelly | H02M 1/08 327/112 |
| 5,438,294 A | * | 8/1995 | Smith | H02M 1/08 327/304 |
| 5,763,962 A | * | 6/1998 | Tsurumi | H03K 17/691 307/129 |
| 2007/0195556 A1 | * | 8/2007 | Nakamura | H02M 1/38 363/16 |
| 2018/0241391 A1 | * | 8/2018 | Chandrasekaran | H03K 17/6871 |
| 2020/0044649 A1 | * | 2/2020 | Le Bars | H02M 1/08 |

OTHER PUBLICATIONS

A. Villarruel-Parra and A. Forsyth, "75 MHz discrete GaN based multilevel buck converter for envelope tracking applications," in Proc. IEEE Appl. Power Electron. Conf. Expo , Mar. 2019, pp. 1553-1560.

(Continued)

*Primary Examiner* — Kenneth B Wells
(74) *Attorney, Agent, or Firm* — Lempia Summerfield Katz LLC

(57) ABSTRACT

A device for driving a control terminal of a transistor includes an input terminal, a transformer including an input winding and an output winding, the input winding being coupled to the input terminal, an n-stage buffer circuit configured to generate a drive signal for the control terminal of the transistor, the n-stage buffer circuit being coupled to a first end of the output winding, and a positive feedback path coupled to an output of a stage of the n-stage buffer circuit to provide a DC offset to an input of the n-stage buffer circuit.

28 Claims, 16 Drawing Sheets

(56) References Cited

OTHER PUBLICATIONS

A. Knott et al., "Evolution of very high frequency power supplies," IEEE J. Emerg. Sel. Topics Power Electron., vol. 2, No. 3, pp. 386-394, Sep. 2014.

E. Abramov, M. Evzelman, and M. M. Peretz, "Low voltage sub-nanosecond pulsed current driver IC for high-speed LIDAR applications," IEEE J. Emerg. Sel. Topics Power Electron., doi: 10.1109/JESTPE.2019.2932143., Sep. 2020.

F. de León, S. Purushothaman, and L. Qaseer, "Leakage inductance design of toroidal transformers by sector winding," IEEE Trans. Power Electron., vol. 29, No. 1, pp. 473-480, Jan. 2014.

H. Wang, J. Wei, R. Xie, C. Liu, G. Tang, and K. J. Chen, "Maximizing the performance of 650-V p-GaN gate HEMTs: Dynamic RON characterization and circuit design considerations," IEEE Trans. Power Electron., vol. 32, No. 7, pp. 5539-5549, Jul. 2017.

J. Glaser, "How GaN power transistors drive high-performance Lidar: Generating ultrafast pulsed power with GaN FETs," IEEE Power Electron. Mag., vol. 4, No. 1, pp. 25-35, Mar. 2017.

L. Balogh, "Design and application guide for high speed MOSFET gate drive circuits," in Proc. Power Supply Des. Seminar SEM-1400 Topic, vol. 2, pp. 1-37, 2001.

L. Gu, Z. Tong, W. Liang, and J. Rivas-Davila, "A multi-resonant gate driver for high-frequency resonant converters," IEEE Trans. Ind. Electron., vol. 67, No. 2, pp. 1405-1414, Feb. 2020.

R. C. N. Pilawa-Podgurski, A. D. Sagneri, J.M. Rivas, D. I. Anderson, and D. J. Perreault, "Very-high-frequency resonant boost converters," IEEE Trans. Power Electron., vol. 24, No. 6, pp. 1654-1665, Jun. 2009.

R. Li, X. Wu, S. Yang, and K. Sheng, "Dynamic on-state resistance test and evaluation of GaN power devices under hard- and soft-switching conditions by double and multiple pulses," IEEE Trans. Power Electron., vol. 34, No. 2, pp. 1044-1053, Feb. 2019.

V. Turriate, B. Witcher, D. Boroyevich, and R. Burgos, "Self-powered gate driver design for a Gallium Nitride based phase shifted full bridge dc-dc converter for space applications," in Proc. IEEE 6th WorkshopWide Bandgap Power Devices AppL, Oct. 2018, pp. 141-148.

X. Zan and A. Avestruz, "Performance comparisons of synchronous and uncontrolled rectifiers for 27.12MHzwireless power transfer using CMCD converters," in Proc. IEEE Energy Convers Congr. Expo , Sep. 2018, pp. 2448-2455.

X. Zan, Z. Guo, and A. Avestruz, "Inductive wireless power transfer at 100 MHz with wide load range and constant output current," in Proc. IEEE Energy Convers Congr. Expo., Sep. 2019, pp. 4967-4975.

Y. Zhang, M. Rodriguez, and D.Maksimovic, "Very high frequency PWM buck converters using monolithic GaN half-bridge power stages with integrated gate drivers," IEEE Trans. Power Electron., vol. 31, No. 11, pp. 7926-7942, Nov. 2016.

Z. Kaplan, "Simple, fully isolated, pulse transformer," Rev. Sci. Instrum., vol. 55, No. 8, pp. 1355-1356, 1984.

Z. Zhang, F.Wang, L. M. Tolbert, and B. J. Blalock, "Active gate driver for crosstalk suppression of SiC devices in a phase-leg configuration," IEEE Trans. Power Electron., vol. 29, No. 4, pp. 1986-1997, Apr. 2014.

Z. Zhang, W. Zhang, F.Wang, L. M. Tolbert, and B. J. Blalock, "Analysis of the switching speed limitation of wide band-gap devices in a phase-leg configuration," in Proc IEEE Energy Convers. Congr Expo., Sep. 2012, pp. 3950-3955.

\* cited by examiner

FEEDBACK-BASED TRANSISTOR DRIVER

CROSS-REFERENCE TO RELATED APPLICATION

This application claims the benefit of U.S. provisional application entitled "Feedback-Based Transistor Driver," filed Jun. 1, 2020, and assigned Ser. No. 63/032,804, the entire disclosure of which is hereby expressly incorporated by reference.

BACKGROUND OF THE DISCLOSURE

Field of the Disclosure

The disclosure relates generally to drive circuits for a control terminal of a transistor.

Brief Description of Related Technology

Ultrafast gate drivers are used in a number of applications. In very high frequency (VHF) applications, ultrafast gate drivers are useful for minimizing loss and expanding the range of operation. In space applications, ultrafast gate drivers are useful for increasing reliability through isolation. In light detection and ranging (LiDAR) applications, ultrafast gate drivers are useful for range accuracy and resolution. Other applications include, for instance, testing of new devices, such as emerging ultrafast devices.

A number of challenges are presented by ultrafast gate drivers. The challenges include providing (1) an ultrafast slew rate, (2) isolation, (3) variable frequency or duty cycle operation, (4) flexible control inputs, and (5) small gating losses. Other challenges include, for instance, achieving arbitrarily long on- and off-times.

An ultrafast slew rate ensures fast switching transitions for narrow pulses and very high frequency. In this way, the transitions do not excessively limit the minimum on-time and dominate switching periods. Fast switching transitions also reduce switching losses in pulse width modulation (PWM) converters and in the turn-off of resonant converters like current-mode class D converters.

Isolation separates the control signal from the gate. In this way, the gate drive voltage can be referenced to the same potential as the source terminal of the power device, which is useful in high-side, low-side, enhanced-mode, and depletion-mode switches. In addition to the isolation of the gate driver control signal, high-side drivers use isolated power supplies, which is challenging at VHF because of coupling capacitance. Even in ground-referenced power switches, isolation provides immunity from the source inductance combined with high di/dt (from high currents and/or fast transitions), which can cause power device mis-triggering when the transients exceed the threshold voltage. This can be especially problematic in devices where the on-state and off-state gate drive voltages are adversely limited by low gate breakdown voltages. Compared to other isolation methods, transformer coupling typically provides better common-mode immunity at high speeds.

Variable frequency and variable duty cycle have been provided to adjust frequency, pulse width, zero voltage switching (ZVS) timing, dead time, or overlap for voltage/ current modulation. Parasitics and component tolerance, temperature variation, and nonlinearity in both pulse, PWM, and resonant converters can be addressed.

Flexible control inputs are used to interface with ultrahigh speed controllers and logic that operate at lower voltages. Such control inputs involve impedance matching, render differential signaling, or are susceptible to loading conditions.

Small gating loss mitigates the escalating losses from switching devices at very high frequency. Gating loss in VHF applications can be as much as 40% of the loss budget at 30 MHz.

Past gate drivers meet some, but not all of these challenges. For instance, a resonant gate driver has been used for reducing the gating loss at VHF, but usually exacerbates the time interval in the "linear region" of the power device and can result in higher loss regardless of whether the gate waveform is sinusoidal or trapezoidal. Also, resonant gate drivers usually have a fixed frequency and duty cycle for a particular configuration and set of components. Digital isolators have been used, but because of low slew rates, digital isolators cannot transmit very short pulses and have a limited maximum operational frequency with relatively large propagation delay. Past methods using transformer isolation can transmit ultrafast pulses and very high frequencies with small propagation delay, but cannot sustain arbitrarily long pulses.

SUMMARY OF THE DISCLOSURE

In accordance with one aspect of the disclosure, a device for driving a control terminal of a transistor includes an input terminal, a transformer including an input winding and an output winding, the input winding being coupled to the input terminal, an n-stage buffer circuit configured to generate a drive signal for the control terminal of the transistor, the n-stage buffer circuit being coupled to a first end of the output winding, and a positive feedback path coupled to an output of a stage of the n-stage buffer circuit to provide a DC offset to an input of the n-stage buffer circuit.

In accordance with another aspect of the disclosure, a method for driving a control terminal of a transistor includes receiving a control signal, magnetically coupling, via a transformer, the control signal to an n-stage buffer circuit, generating, via the n-stage buffer circuit, a drive signal for the control terminal of the transistor, and providing positive feedback from an output of a stage of the n-stage buffer circuit to establish a DC offset voltage of the transformer.

In accordance with yet another aspect of the disclosure, a method for driving a control terminal of a transistor includes receiving a control signal, magnetically coupling, via a transformer, the control signal to an n-stage buffer circuit, generating, via the n-stage buffer circuit, a drive signal for the control terminal of the transistor, and providing positive feedback from an output of a stage of the n-stage buffer circuit such that a level of an output of the n-stage buffer circuit is maintained as long as the control signal remains constant.

In accordance with yet another aspect of the disclosure, a system includes a transistor having a gate, and a gate driver configured to generate a gate drive signal, the gate driver being coupled to the gate. The gate driver includes an input terminal, a transformer including an input winding and an output winding, the input winding being coupled to the input terminal, an n-stage buffer circuit configured to generate the gate drive signal, the n-stage buffer circuit being coupled to a first end of the output winding, and a positive feedback path coupling an output of a stage of the n-stage buffer circuit to a second end of the output winding.

In connection with any one of the aforementioned aspects, the devices and/or methods described herein may alternatively or additionally include or involve any combination of one or more of the following aspects or features. The positive feedback path is coupled to a second end of the output winding. The positive feedback path establishes a DC offset voltage for the output winding of the transformer at the second end of the output winding. The positive feedback path is configured to provide direct feedback. The positive feedback path is configured to provide resistive feedback. The device further includes a further positive feedback path between two stages of the n-stage buffer circuit. The device further includes a further feedback path within the n-stage buffer circuit, the further feedback path including an inverter circuit. The device further includes a non-inverting feedback path within the n-stage buffer circuit. The device further includes a further positive feedback path coupling a further stage output of the n-stage buffer circuit to the second end of the output winding. Each stage of the n-stage buffer circuit includes an inverter circuit. Each inverter circuit of the pair of inverter circuits includes a series of cascaded inverters. At least one stage of the n-stage buffer circuit includes a parallel arrangement of buffer devices. A first stage of the n-stage buffer circuit includes a first number of parallel buffer devices. A second stage of the n-stage buffer circuit has a second number of parallel buffer devices, the second stage following the first stage. The second number is greater than the first number. A first stage of the n-stage buffer circuit includes a buffer device having a first size. A second stage of the n-stage buffer circuit includes a buffer device having a second size, the second stage following the first stage. The second size is larger than the first size. The stage of the n-stage buffer circuit coupled by the positive feedback path to the second end of the output winding is an intermediate stage of the n-stage buffer circuit. The stage of the n-stage buffer circuit coupled by the positive feedback path to the second end of the output winding is a final stage of the n-stage buffer circuit. The n-stage buffer circuit is configured as a single-stage buffer. The drive signal is a current signal. The drive signal is a voltage signal. Generating the drive signal includes, in a respective stage of the n-stage buffer circuit, inverting an input signal to the respective stage, and inverting the inverted input signal. Generating the drive signal includes generating two voltages that are differential. Generating the drive signal includes increasing a current drive of the drive signal via processing by successive stages of the n-stage buffer circuit. Providing the positive feedback includes providing an output of an intermediate stage of the n-stage buffer circuit. Providing the positive feedback includes providing, from an output of a further stage of the n-stage buffer circuit, further feedback to establish the DC offset voltage of the transformer. Providing the positive feedback includes providing further positive feedback between two stages of the n-stage buffer circuit

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 1:
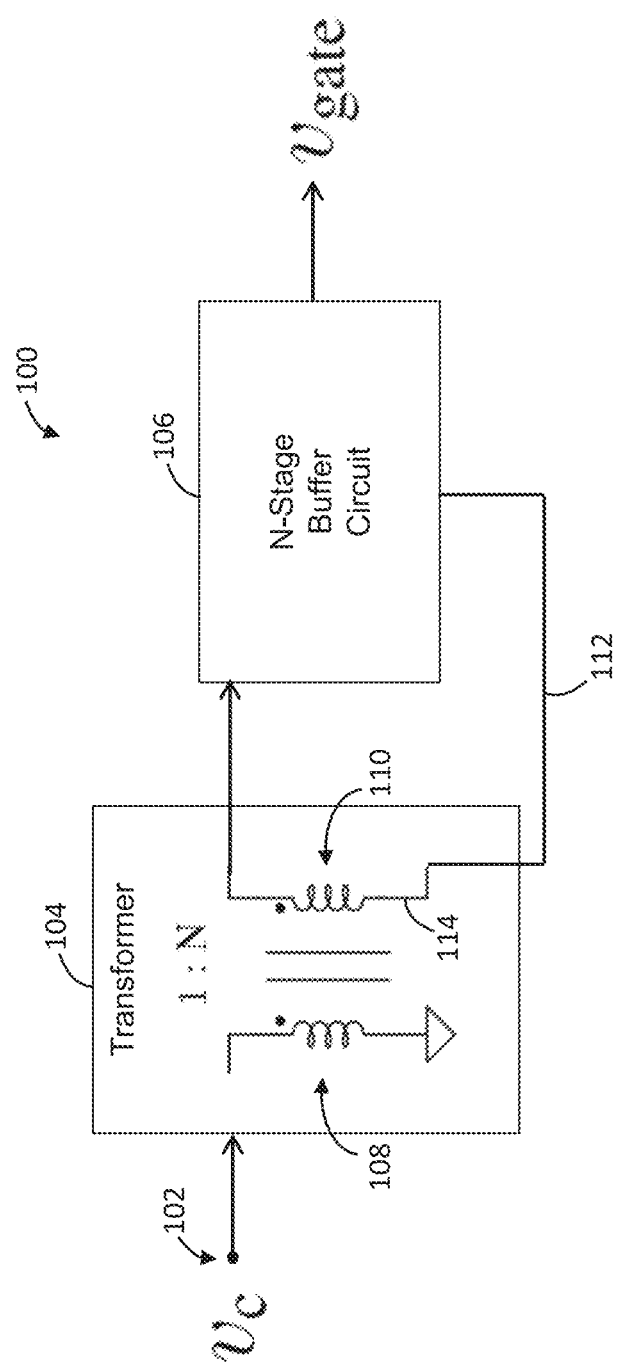
FIG. 1 is a schematic view of a gate driver with feedback in accordance with one example.

The embodiments of the disclosed devices, systems, and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

Devices and methods for driving power and other transistor devices with arbitrarily long on- and off-times are described. Power electronic and other systems using the devices and methods are also described. The disclosed devices, methods, and systems provide arbitrarily long on- and off-times using transformer isolation. In some cases, the disclosed devices are configured as ultrafast and isolated gate drivers. Galvanic, dc, or ac isolation may be used. The disclosed devices, systems, and methods use a circuit architecture with magnetic isolation and positive feedback to provide arbitrarily long on- and off-times, while remaining capable of ultrafast operation (e.g., rise and fall times below 260 ps, as well as gate voltage slew rates above 12 GV/s). Long pulses may be useful in a variety of applications involving, for instance, charging current to specific levels.

The positive feedback of the circuit architecture provides automatic, dynamic DC restoration to support variable frequency, duty cycle operation, and arbitrarily long on- and off-times for pulses. The feedback-based dynamic DC restoration alleviates the tradeoffs presented in the design of isolation transformers for VHF operation. Signal integrity and fidelity during VHF operation is challenging. Isolation may help with signal integrity and fidelity, but at a cost to variable duty cycle (or pulse width) operation. More favorable trade-offs involving magnetizing inductance, self-resonance, leakage inductance, and coupling capacitance are presented. The magnetic isolation may thus still be used to ensure common-mode transient immunity, while the positive feedback enables variable duty cycles.

The arbitrarily long on- and off-times provided by the disclosed devices, systems, and methods may be useful in various contexts, including, for instance, during startup or closed-loop control conditions. Arbitrarily long on- and off-times are useful in driving the gate when the converter deviates from steady-state operation. To preserve duty cycle and arbitrarily long on- and off-times, the dynamic DC restoration of the disclosed devices, systems, and methods supports high speed isolation techniques (e.g., capacitive or transformer coupling). Such isolation with arbitrarily long on- and off-times becomes increasingly challenging as transition times approach 100 picoseconds (ps), and as switching frequencies reach deeper into the VHF range. For instance, methods that use transformer isolation in contrast can transmit fast pulses at VHF with small propagation delay, but cannot sustain arbitrarily long pulses.

The disclosed devices, systems, and methods may be used in a wide variety of applications. The ultrafast and isolated gate drivers and other devices disclosed herein may be used in various pulse and VHF power electronic systems, including applications such as LiDAR, space systems, and miniaturized hardware. Other applications and systems may use the gate drivers and other devices disclosed herein including, for instance, systems directed to testing and evaluation of emerging devices.

Although described in connection with field effect transistors and power electronics devices, the disclosed devices and methods may be used with a wide variety of transistor devices. The disclosed devices and methods may be used to drive any type of transistor control terminal, including, for instance, a base terminal. The disclosed devices and methods may thus drive current-controlled transistor devices, such as bipolar junction transistors. The configuration and characteristics of the transistor devices may vary in other ways. For instance, the transistor devices may have three or four terminals. The transistor devices may or may not be power transistors. The size and output characteristics of the transistor devices may vary accordingly.

FIG. 1 depicts a device 100 for driving a control terminal of a transistor in accordance with one example. The transistor may be a field effect or other transistor. The control terminal may thus be or include a gate terminal, or gate. In such cases, the device 100 may be configured as a gate driver. The nature, configuration, and characteristics of the device 100 may vary in accordance with the nature of the control terminal.

The transistor may be or include a power or other transistor. The transistor may control the delivery of power to a load. The power may be delivered in the form of a controlled current and/or a controlled voltage. The nature of the load may vary accordingly and considerably.

The device 100 includes one or more input terminals 102, a transformer 104, and an n-stage buffer circuit 106. An input or control signal $v_c$ is received at the input terminal 102. The input signal may be a differential signal in other cases. In this example, the input signal is directly provided to an input or primary winding 108 of the transformer 104. In other cases, the input signal is indirectly provided to the transformer 104. For example, the device 100 may include a DC blocking capacitor between the input terminal 102 and the transformer 104. Additional or alternative circuit elements may also be coupled to, or otherwise included at, the input terminal 102 and the input winding 108. For example, additional elements may be included for impedance matching. Further details regarding examples are provided below in connection with FIGS. 2 and 3.

The control signal received at the input terminal 102 may be single-ended or differential. In the example of FIG. 1, the control signal is single-ended relative to a ground reference. The ground reference may or may not correspond with the ground or other reference used by the remainder of the device 100 and the load.

The transformer 104 provides isolation relative to the input terminal 102. The transformer 104 boosts the control signal $v_c$ by the turns ratio 1:N of the transformer 104. In one example, the turns ratio is 1:2, but other ratios may be used. The transformer 104 may also include or be otherwise configured to match impedance. The transformer 104 may be or include an RF signal transformer and/or a broadband signal transformer. In one example, the transformer 104 has a bandwidth from about 1.5 MHz to about 1.2 GHz, but the bandwidth may vary.

The configuration of the transformer 104 may vary. The input or primary winding 108 of the transformer 104 may be one of any number of input windings. Each input winding 108 may be coupled to the input terminal 102. Alternatively, one or more input windings may be coupled to an alternative or additional input terminal.

The transformer 104 includes one or more output (or secondary) windings 110. In this example, the transformer 104 includes a single output winding 110. One end of the output winding 110 is coupled to the n-stage buffer circuit 106. Additional output windings may be coupled to other circuits, e.g., other buffer circuits, for driving control terminals (e.g., gates) of additional transistors.

The n-stage buffer circuit 106 is configured to generate a drive signal (e.g., $v_{gate}$) for the control terminal of the transistor. The drive signal is generated from an input received from the secondary winding 110 of the transformer 104. The input may be an input voltage. The gain of the n-stage buffer circuit 106 may vary.

The n-stage buffer circuit 106 may include one or more stages. The n-stage buffer circuit 106 may thus include, or otherwise be configured as, a single-stage or multiple-stage buffer. Each stage may include one or more buffer devices. For example, each stage may include one or more inverters (e.g., logic inverters). Reliance on inverters to provide buffering may be useful for realizing high speed operation, e.g., minimizing, reducing, or otherwise achieving a desired level of propagation delay. Further details regarding inverter-based buffer circuits are provided below in connection with a number of examples. Additional or alternative buffer devices may be included in the n-stage buffer circuit 106, including, for instance, various types of amplifiers.

Figure 2:
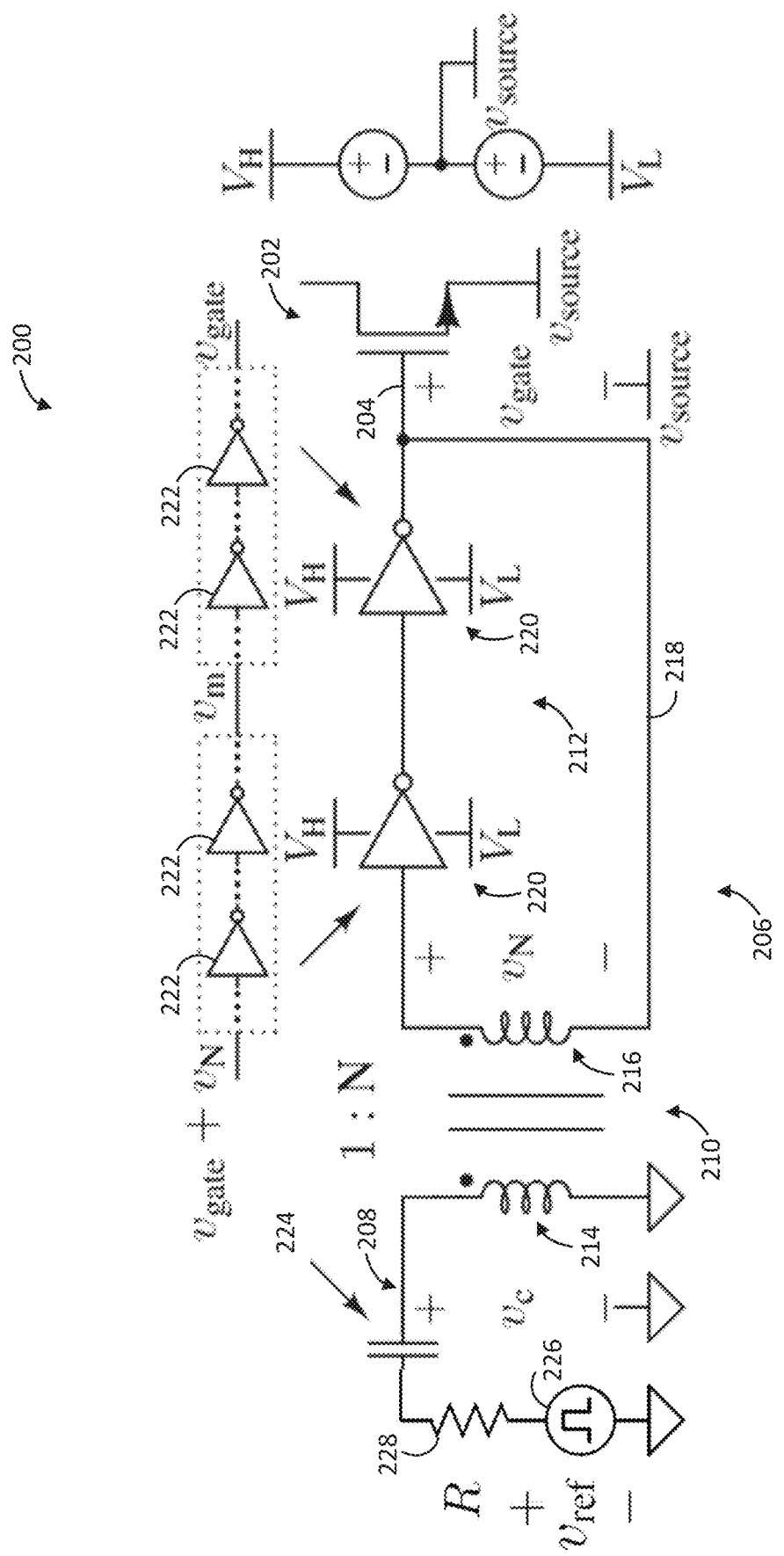
FIG. 2 is a schematic view of a power electronics system with a gate driver having feedback in accordance with one example.

The device 100 also includes a positive feedback path 112. The positive feedback path 112 may be from a final stage and/or an intermediate stage of the n-stage buffer circuit 106. The positive feedback path 112 provides a DC offset to an input of the n-stage buffer circuit 106. The input of the n-stage buffer circuit 106 may thus be considered to include a component provided via the transformer 104 (e.g., $v_N$, as shown in FIG. 2) and a feedback component. In some cases, the feedback component is or is otherwise based on, the drive signal (e.g., $v_{gate}$, as shown in FIG. 2), in which case the input may become, e.g., $v_N+v_{gate}$ (see, e.g., FIG. 2). Alternatively or additionally, the feedback component may correspond with, or otherwise be based on, the output of an intermediate stage.

In the example of FIG. 1, the positive feedback path 112 couples an output of a stage of the n-stage buffer circuit 106 to an end 114 of the secondary winding 110. The positive feedback path 112 may thus provide a DC offset for the secondary winding 110 of the transformer 104 at the end 114 of the output (or secondary) winding 110 of the transformer 104. The DC offset is then passed along as part of the input to the n-stage buffer circuit 106. The termination points of the positive feedback path 112 may vary in other cases, as described hereinbelow.

The positive feedback path 112 provides dynamic DC restoration for the device 100. The offset dc voltage fed back to the transformer 104 depends on the state of the drive signal. This results in the drive signal output state of the device 100 being held (e.g., either high or low) despite the inevitable voltage decay or droop in the secondary winding 110 of the transformer 104.

The characteristics of the positive feedback path 112 may vary. In the example of FIG. 1, the positive feedback path 112 is configured to provide direct feedback. In other cases, the positive feedback path 112 may include one or more elements directed to configuring the positive feedback. For instance, the positive feedback path 112 may include one or more resistors (e.g., resistive feedback) and/or one or more inverters (inverter feedback) to provide various types of indirect feedback.

The gain of the n-stage buffer circuit 106 may vary. The gain may be scaled (e.g., progressively scaled) via the multiple stages. Examples are described below in connection with, e.g., FIGS. 2 and 4. In some cases, the gain of the n-stage buffer circuit 106 may be established via one or more voltage dividers. The nature of the drive signal may vary in other ways. For instance, the drive signal may be a current signal in other cases. Alternatively or additionally, the drive signal may be a differential signal, e.g., provided by generating two voltages that are differential.

FIG. 2 depicts a system 200 having a transistor 202 with a control terminal 204 driven with positive feedback in accordance with one example. The system 200 may be a power electronics system in which the transistor 202 acts as a switch for controlling the delivery of power to a load. In this example, the transistor 202 is a field effect transistor (FET), such as a GaN or other power FET. The control terminal 204 is the gate terminal of the FET device. The gate terminal 204 is referenced to a source terminal of the transistor 202 that resides at a voltage level $v_{source}$. The voltage level $v_{source}$ may or may not be referenced to a ground reference of a control signal $v_c$. The voltage level $v_{source}$ may or may not be isolated. In some cases, the voltage level $v_{source}$ is AC isolated from the control signal $v_c$, but not necessarily galvanically isolated. These reference voltage options may be applied to any one or more of the other gate drivers or other devices or systems described herein.

In one LiDAR example, the transistor 202 is a GaN FET, such as the enhancement mode GaN FET power transistor commercially available from Efficient Power Conversion Corporation (www.EPC-co.com) as EPC 2038. The gate charge of the EPC 2038 GaN FET uses an average driving current at a switching frequency of 100 MHz of 4.4 mA. Other FET devices may be driven. The size and other characteristics of the transistor may accordingly vary. For instance, the GaN FET commercially available from GaN Systems (www.gansystems.com) as GS-065-004-1-L FET may be used.

The system 200 includes a gate driver 206 configured to generate a gate drive signal $v_{gate}$ for the gate terminal 204. The gate driver 206 is accordingly coupled to the gate terminal 204. The gate driver 206 includes an input terminal 208, a transformer 210, and an n-stage buffer circuit 212 configured to generate the gate drive signal. In this example, the n-stage buffer circuit 212 is a two-stage buffer circuit. A stage may thus correspond with a single inverter. An input winding 214 (e.g., primary winding) of the transformer 210 is coupled to the input terminal 208. One end of an output winding 216 (e.g., secondary winding) of the transformer 210 is coupled to the n-stage buffer circuit 212.

The gate driver 206 includes a positive feedback path 218 coupling an output of the n-stage buffer circuit 212 to the other end of the output winding 216 of the transformer 210. In this example, the positive feedback path 218 couples an output of the final stage (e.g., second stage) of the n-stage buffer circuit 212 to the secondary winding 216 of the transformer 210. The positive feedback path 218 is a direct feedback path in this case.

In the example of FIG. 2, each stage of the n-stage buffer circuit 212 includes an inverter circuit 220. Each inverter circuit 220 may include or be otherwise configured as a composite inverter arrangement. In this example, each inverter circuit 220, in turn, includes a series of cascaded inverters 222 (e.g., logic inverters). The inverters may be buffered or unbuffered. Buffered inverters may have additional internal circuitry to improve input impedance, output impedance, or noise immunity. The logic inverters 222 may be provided in pairs as shown. Any number of pairs may be provided in each inverter circuit 220. The composite arrangement of the inverters 222 establishes an aggregate propagation delay $T_{pd}$ from an input voltage to $v_{gate}$ in the forward path, which is the sum of the propagation delays of the logic inverters 222.

The input voltage of the composite inverter arrangement corresponds with the output of the transformer ($v_N+v_{gate}$). An intermediate voltage $v_m$ is developed between the stages of the buffer circuit 212, and the output voltage $v_{gate}$ drives the transistor 202. The output voltage $V_{gate}$ is also connected to the secondary winding 216 of the transformer 210 to provide positive feedback for dynamic DC restoration, as described herein. The offset dc voltage to the transformer secondary depends on the output state. This results in the gate driver output state being held despite the inevitable voltage decay or droop in the secondary winding. The composite inverter arrangement is thus well suited for both short-pulse operation (e.g., when the on- and off-times are sufficiently short so that the voltage droop on the transformer secondary is negligible) and long-pulse operation (e.g., where arbitrarily long on- or off-times result in the decay of the transformer secondary voltage to nearly zero). Without the dynamic DC restoration of the positive feedback, the voltage droop on the transformer secondary would otherwise result in mistriggering and an inability for the output voltage $v_{gate}$ to hold its state.

Each logic inverter 222 may be powered by voltages $V_H$ and $V_L$. In one example, the voltages $V_H$ and $V_L$ are 5 Volts (V) and 0 V, respectively. However, the logic inverters may have a wide range of operating voltages (e.g., −0.5 V to 6.5 V), such that use of logic inverters may lead to the gate driver 206 being capable of operation at a wide range of driving voltages. The inputs to the logic inverters 222 may be clamped such that clamp voltage $V_{clampL}$ is less than $V_L$ and $V_{clampH}$ is greater than $V_H$ for proper operation. In some cases, the logic inverter threshold, $V_{th}$, is equal to or about half of the sum of the voltages $V_H$ and $V_L$. However, other logic inverter thresholds may be used. For instance, the threshold voltages may be different for low-to-high and high-to-low transitions. These and other voltages relevant to the logic inverters 222 may be referenced to the source voltage $v_{source}$.

Each inverter circuit 220 may be implemented with varying levels of integration. For instance, each inverter circuit 220 may be provided as an integrated circuit in some cases. Alternatively, the inverters 222 may be provided as discrete devices. The devices may differ between stages. For instance, the devices may be scaled in size as described below. The scaled devices may minimize aggregate propagation delay for a current drive level called for by the transistor 202. In discrete implementations, parallel inverters may alternatively or additionally be used to increase the current drive, as described below.

In one example in which the EPC 2038 FET was driven, the gate driver 206 achieved a slew rate above 12 GV/s, with rise and fall times below 260 ns. In another example involving a larger FET (GS-065-004-1-L), the gate driver 206 also achieved a slew rate above 12 GV/s with rise and fall times below 270 ns. Magnetic isolation up to 1.2 GHz was attained, while preserving duty cycle and achieving common-mode rejection. The results were achieved over a wide frequency range from about 30 MHz to about 165 MHz.

The system 200 depicts an example in which a DC blocking capacitor 224 is provided in series with the input winding 214 of the transformer 210. The DC blocking capacitor 224 may be configured to establish zero average voltage at the input winding 214 of the transformer 210. The DC blocking capacitor 224 may be considered a component of the input terminal 208 and/or a circuit for generating or providing the control signal $v_c$. The DC blocking capacitor 224 may be used to determine or establish the droop time constant.

The system 200 depicts an example in which the gate driver 206 is triggered by a voltage waveform from a voltage source $v_{ref}$ 226. In this example, the system 200 includes a resistor (R) 228 in series with the voltage source $v_{ref}$ 226. The resistor 228 may be configured as an impedance matching resistor. The resistor 228 may be configured or used to determine or establish the droop time constant.

Any one of the gate drivers or other devices described herein for driving a control terminal may be incorporated into the system 200. Conversely, the gate driver 206 may be incorporated into other power electronic or other systems in which a gate or other control terminal is driven.

Figure 3:
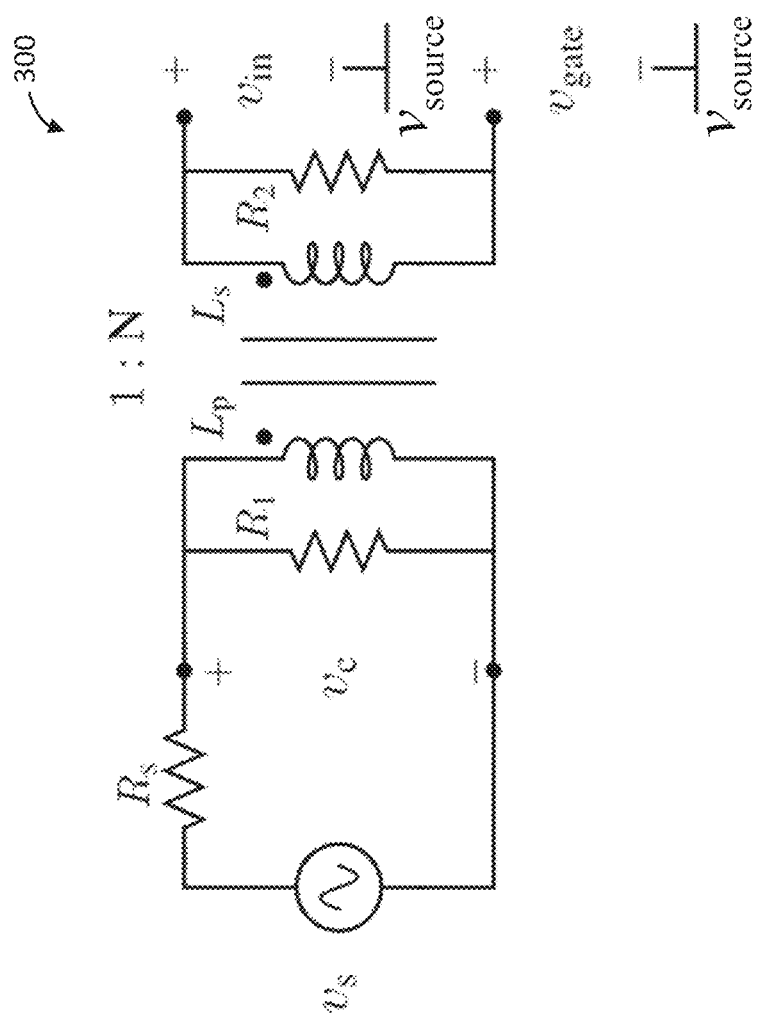
FIG. 3 is a schematic view of a transformer for use with the disclosed devices, methods and systems in accordance with one example.

FIG. 3 depicts a transformer 300 in accordance with one example. The transformer 300 may be used for magnetic isolation in any of the devices, systems or methods described herein. The transformer 300 may also be modified to include any one or more of the features described herein in connection with other transformers. For example, the transformer 300 may be modified to include a DC blocking capacitance.

The transformer 300 provides the isolation between a control signal $v_s$ and a power or other transistor to which an output winding of the transformer 300 is coupled. In this example, the transformer 300 provides the isolation along with impedance matching. The impedance of the source of the control signal vs is represented by a resistance $R_s$. The resistance $R_s$ may be an explicit resistance. The impedance matching may be provided by the resistance $R_s$. The impedance matching may be provided with resistors $R_1$ and $R_2$. The resistor $R_1$ is connected in parallel with an input winding of the transformer 300. The resistor $R_2$ is connected in parallel with an output winding of the transformer 300. Other impedance matching circuit arrangements may be used.

The transformer 300 may include alternative or additional resistive arrangements for purposes other than matching. For instance, one or more resistors may be included to dampen undesired resonances. In some cases, a resistance may be disposed in series with one or more of the inductances of the transformer 300.

The transformer 300 may include still further alternative or additional impedance arrangements, including, for instance, where resistors $R_1$ and $R_2$ are replaced by various circuit combinations of resistors, inductors, and capacitors for the purposes of impedance matching and/or dampening of undesired resonances.

Figure 4:
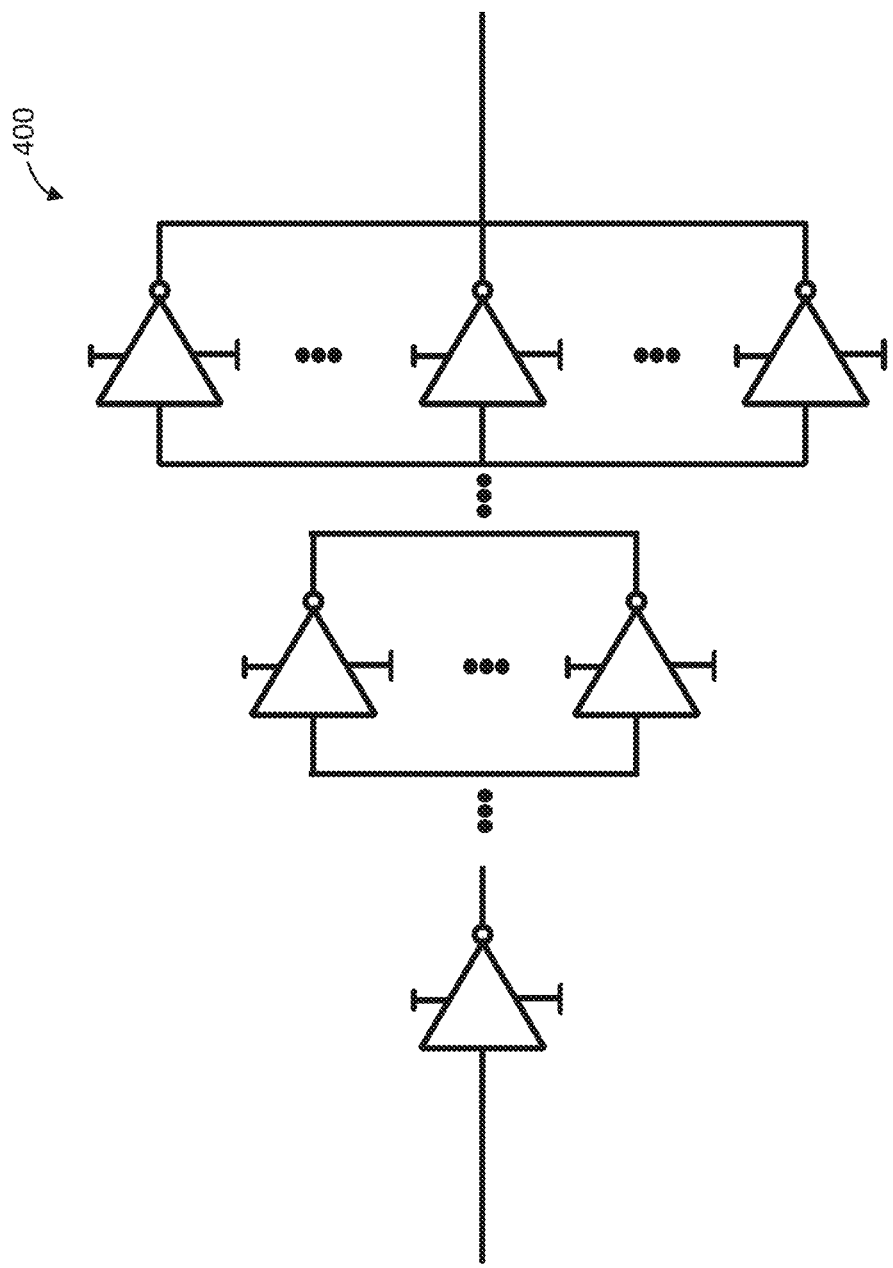
FIG. 4 is a schematic view of a buffer circuit for use with the disclosed devices, methods and systems in accordance with one example.

FIG. 4 depicts an n-stage buffer circuit 400 in accordance with one example. The n-stage buffer circuit 400 may be used in any of the devices, systems or methods described herein. The n-stage buffer circuit 400 may also be modified to include any one or more of the features described herein in connection with other buffer circuits.

As with other examples, the n-stage buffer circuit 400 includes a composite inverter arrangement. The arrangement is provided in a number of stages. In this case, one or more of the stages includes a parallel arrangement of inverter devices or circuits. The parallel arrangement of the inverters may be used to achieve a desired level of current driving capability. The number of stages in the n-stage buffer circuit 400 may be selected to achieve the desired level of driving capability without introducing an undesirable amount of propagation delay.

Each inverter shown in FIG. 4 may represent an inverter circuit having, for instance, a pair of inverter devices. For ease in description, each inverter device or circuit will be referred to as an inverter with the understanding that each referenced inverter may represent a series or other combination of inverter devices. The extent to which the inverters are integrated may vary as desired.

The number of parallel inverters in each stage may increase progressively. In the example of FIG. 4, the initial stage includes a single inverter. The second and third stages include two and three parallel inverters, respectively. Additional or alternative stages may be provided. For instance, the number of inverters in each successive stage may double, and any number of stages may be provided.

The inverters may or may not be uniform across the composite inverter arrangement of FIG. 4. The size of the inverters may be scaled or otherwise adjusted to minimize or otherwise reduce aggregate propagation delay. For example, the inverters in the first stage may be small (e.g., the smallest) in size to present a small input capacitance. The size of the inverters in one or more of the following stages may be larger (e.g., progressively larger) to increase the current drive capability of the buffer circuit 400.

The n-stage buffer circuit 400 may include a combination of varying sizes and parallelization to achieve a desired level of driving capability and, thus, desired rise and fall times, and slew rate. For instance, the size(s) of the inverters may be selected to achieve a given current drive capability for an acceptable number of stages with a given amount of parallelization.

In other examples, the inverter devices of the n-stage buffer circuit 400 may be replaced with other buffer devices. For example, one or more of the stages may include a parallel arrangement of amplifiers or amplifier circuits.

Figure 5:
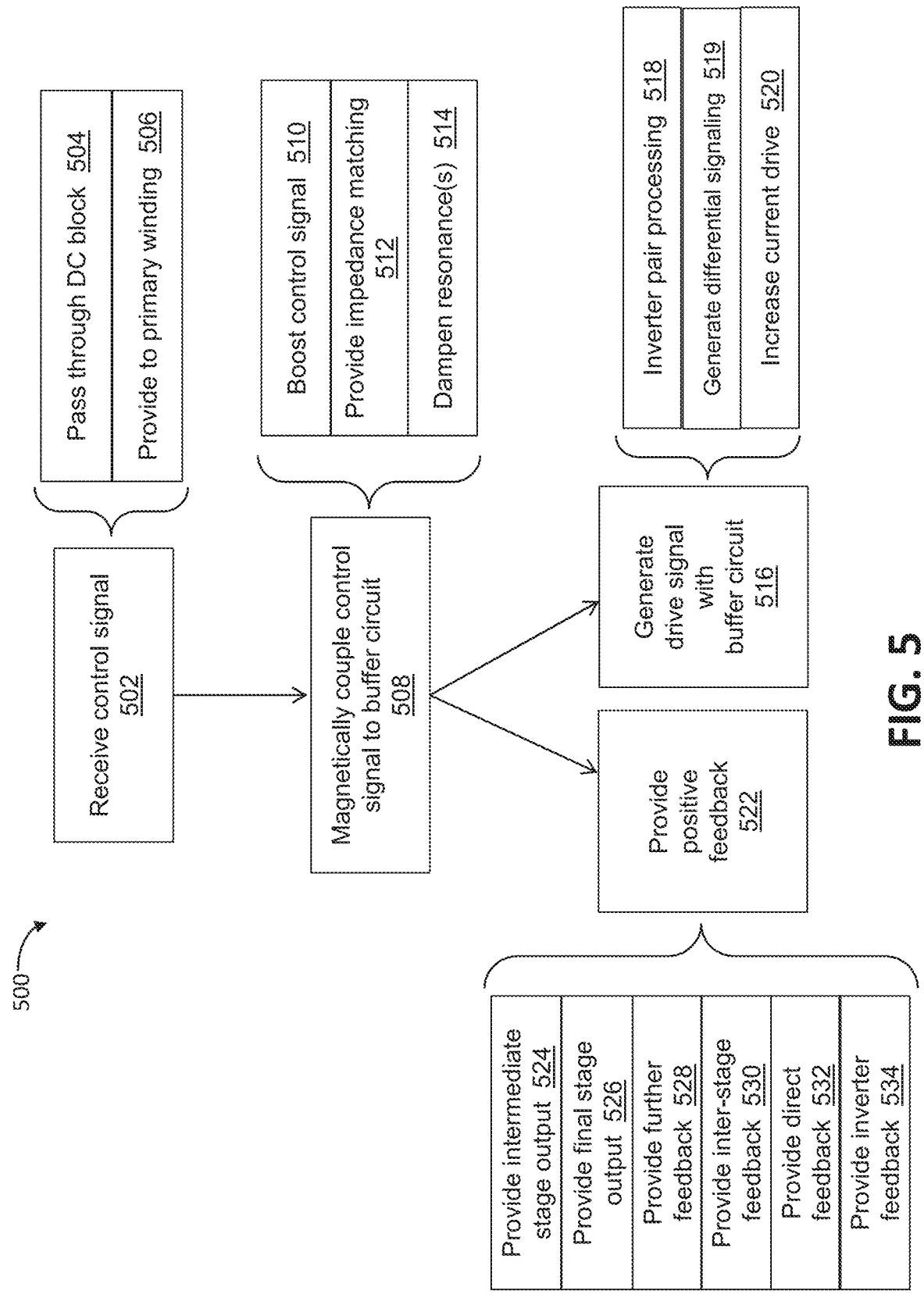
FIG. 5 is a flow diagram of a feedback-based method of driving a control terminal of a transistor in accordance with one example.

FIG. 5 depicts a method 500 for driving a control terminal of a transistor. The method 500 may be implemented by the device 100 of FIG. 1, the system 200 of FIG. 2, or any one of the other devices and systems described herein, or another device or system. The transistor driven via implementation of the method 500 may vary as described herein. The nature of the control terminal may vary accordingly. In some cases, more than one transistor control terminal is driven via implementation of the method 500.

The method 500 may begin with an act 502 directed to receiving a control signal. The control signal may be or include a voltage signal, such as the voltage signals described herein. The control signal may be received at an input terminal and/or via an input circuit. The input terminal or circuit may include any number of components or elements directed to receiving the control signal.

Receiving the control signal may include processing the control signal, e.g., in preparation for implementation of further acts of the method 500. For example, the control signal may be passed through a DC block in an act 504. The control signal may also pass through additional or alternative circuitry, such as one or more resistors, capacitors, and/or inductors, for impedance matching, resonance dampening, and/or other purposes. Once the control signal has been processed, the act 502 may include providing the control signal to a primary or other input winding of a transformer in an act 506.

In an act 508, the control signal is magnetically coupled, via the transformer, to a n-stage buffer circuit. The transformer may be configured as described herein. For instance, the transformer may boost the control signal in accordance with the turns ratio of the transformer in an act 510. The transformer may also be configured for impedance matching with, e.g., the input terminal or circuit and/or the n-stage buffer circuit. Alternatively or additionally, the transformer may be configured with one or more resistances to dampen any resonances. The act 508 may accordingly include providing impedance matching in an act 512 and dampening one or more resonances in an act 514.

A drive signal for the control terminal of the transistor is generated via an n-stage buffer circuit in an act 516. The n-stage buffer circuit may be configured as described herein, or otherwise configured. In some cases, the drive signal is generated by processing an output of the transformer by one or more pairs of inverter devices or circuits in an act 518. For instance, in any one or more of the stages of the n-stage buffer circuit, an input signal to the respective stage may be inverted, and then the inverted input signal is inverted back. Other types of buffer devices and/or circuits may be used.

Alternatively or additionally, the act 516 includes an act 519, in which differential signaling is generated. For example, two voltages that are differential may be generated, as described above.

Alternatively or additionally, the act 516 includes an act 520 in which the current drive capability is increased. The current drive of the drive signal may be increased via processing by successive stages of the n-stage buffer circuit that differ in one or more ways. In some cases, the devices of the successive stages differ in size. Alternatively or additionally, the successive stages differ in the number of devices arranged in parallel.

In an act 522, positive feedback from an output of one or more stages of the n-stage buffer circuit is provided. The positive feedback is provided so that a level of an output of the n-stage buffer circuit is maintained as long as the control signal remains constant. In some cases, the positive feedback is provided to a secondary or other output winding of the transformer to establish a DC offset voltage of the transformer.

The source of the positive feedback may vary. In some cases, the positive feedback involves or otherwise includes providing the output of an intermediate stage of the n-stage buffer circuit in an act 524. Alternatively or additionally, the positive feedback involves or otherwise includes providing the output of a final output the n-stage buffer circuit in an act 526. When the outputs of multiple stages are provided in connection with the feedback, the act 522 may thus include an act 528 in which further feedback (e.g., resistive feedback) is provided. Alternative or additional positive feedback may be provided in an act 530 in which positive feedback is provided between two stages of the n-stage buffer circuit.

Any of the above-referenced positive feedback mechanisms may be provided in various ways. The characteristics of the feedback path may vary accordingly. For instance, the feedback may be provided directly in an act 532, e.g., without any intervening processing by one or more circuit elements. Alternatively or additionally, inverter-based feedback may be provided in an act 534. Still other feedback may be resistive, e.g., with one or more resistors in the feedback path.

The method 500 may include fewer, additional or alternative acts. For instance, the method 500 may include one or more acts directed to generating the control signal.

The acts may be implemented in an order other than the order shown in FIG. 5. For instance, the acts 502, 508, 516, and 522 may be implemented concurrently. The order of the acts may also depend on implementation timing and configuration of the feedback path. The positive feedback may thus be provided before or after the drive signal is generated in the act 516.

Figure 6:
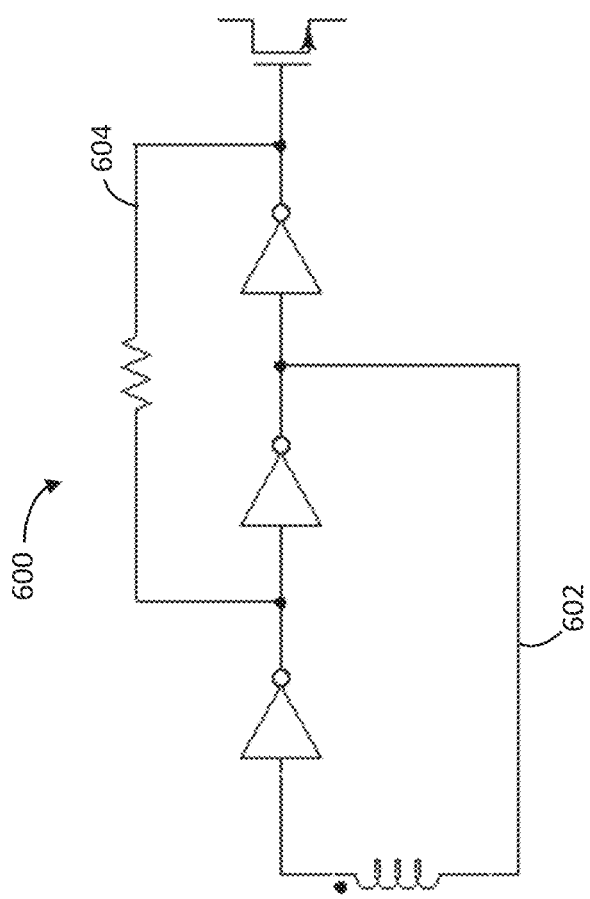
FIG. 6 is a schematic view of a feedback arrangement for use with the disclosed devices, methods and systems in accordance with one example.

FIG. 6 depicts an n-stage buffer circuit 600 with multiple feedback paths in accordance with one example. In this case, two feedback paths are provided.

A positive feedback path 602 provides the output of an intermediate stage of the n-stage buffer circuit 600 to the output winding of a transformer. In this example, the positive feedback path 602 is a direct feedback path, but other types of feedback (e.g., resistive, etc.) may be additionally or alternatively provided. The stage from which the feedback is provided may also vary.

A positive feedback path 604 is also established between two stages of the n-stage buffer circuit 600. In this example, the positive feedback path 604 couples the output of a final stage to the input of an intermediate stage. In this case, the intermediate stage is the second stage of the n-stage buffer circuit 600. Other stages may provide and receive the feedback in other cases. In this case, the positive feedback path 604 is a resistive feedback path, but other types of feedback (e.g., direct, inverted, etc.) may be provided.

Fewer or additional feedback paths may be provided in other cases. For instance, a further feedback path may be provided to the output winding of the transformer.

Figure 7:
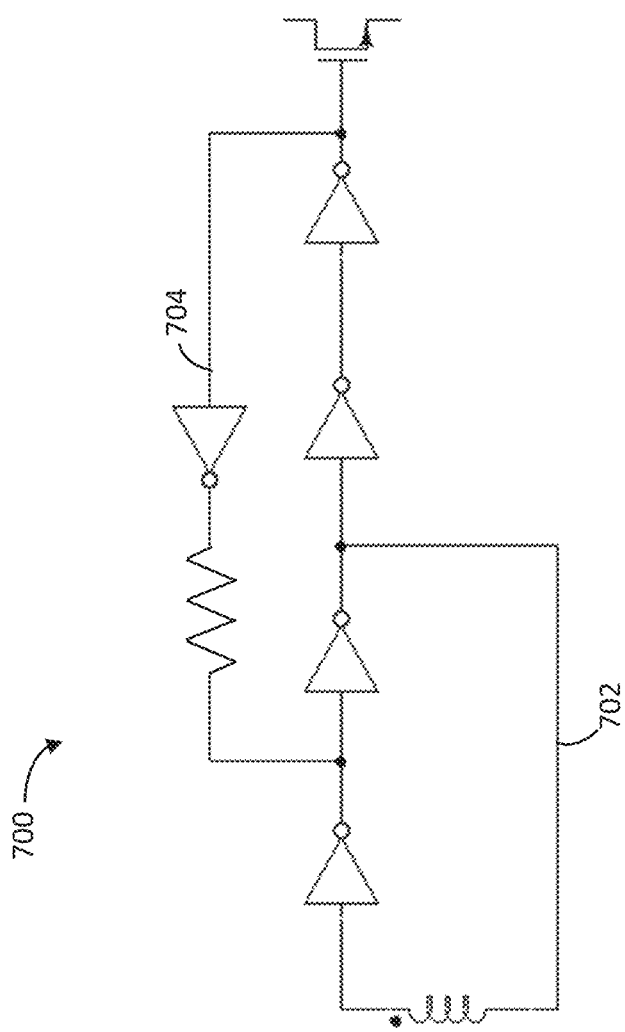
FIG. 7 is a schematic view of a feedback arrangement for use with the disclosed devices, methods and systems in accordance with another example.

FIG. 7 depicts an n-stage buffer circuit 700 with multiple feedback paths in accordance with one example. In this case, two feedback paths are provided.

A positive feedback path 702 provides the output of an intermediate stage of the n-stage buffer circuit 700 to the output winding of a transformer. In this example, the positive feedback path 702 is a direct feedback path, but other types of feedback (e.g., resistive, etc.) may be additionally or alternatively provided. The stage from which the feedback is provided may also vary.

A feedback path 704 is also established between two stages of the n-stage buffer circuit 700. In this example, the positive feedback path 704 couples the output of a final stage to the input of an intermediate stage. In this case, the intermediate stage is the second stage of the n-stage buffer circuit 700. Other stages may provide and receive the feedback in other cases. In this case, the positive feedback path 704 includes an inverter device or circuit. The positive feedback path 704 may thus be configured as an inverted feedback path, but other types of feedback (e.g., direct, resistive, etc.) may be provided. In this example, the feedback path 704 includes a resistor in series with the inverter circuit, but the configuration or other characteristics of the feedback paths 702, 704 may vary from the example shown.

Fewer or additional feedback paths may be provided in other cases. For instance, a further feedback path may be provided to the output winding of the transformer.

Figure 8:
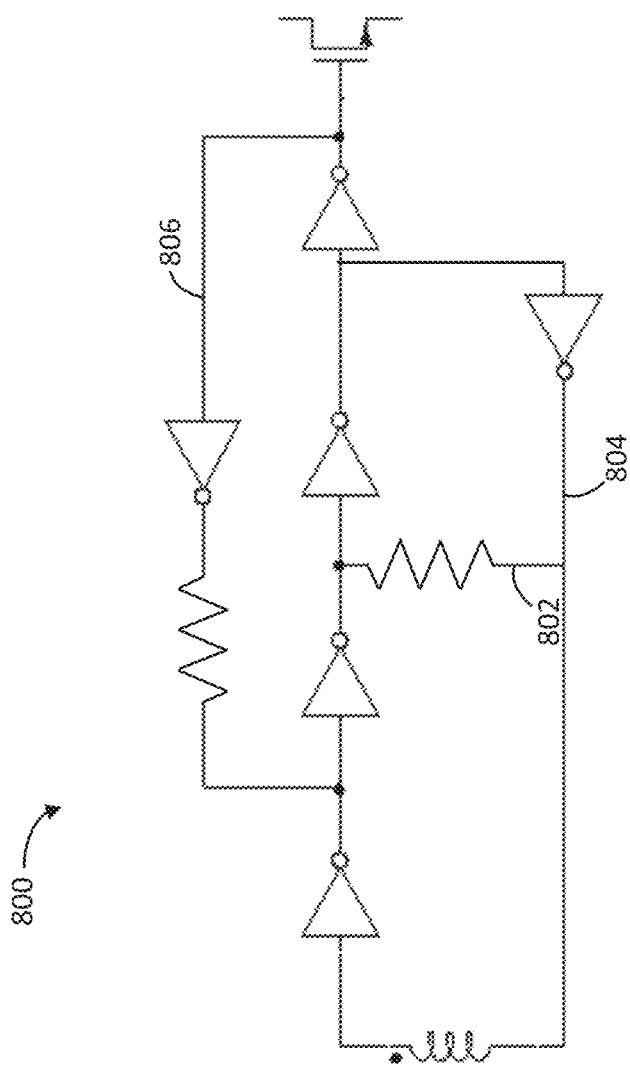
FIG. 8 is a schematic view of a feedback arrangement for use with the disclosed devices, methods and systems in accordance with yet another example.

FIG. 8 depicts an n-stage buffer circuit 800 with multiple feedback paths in accordance with one example. In this case, three feedback paths are provided.

A positive feedback path 802 provides the output of an intermediate stage of the n-stage buffer circuit 800 to the output winding of a transformer. In this example, the positive feedback path 802 is a resistive feedback path, but other types of feedback (e.g., direct, etc.) may be additionally or alternatively provided. The stage from which the feedback is provided may also vary.

A further feedback path 804 provides the output of a final stage of the n-stage buffer circuit 800 to the output winding of the transformer.

A feedback path 806 is also established between two stages of the n-stage buffer circuit 800. In this example, the positive feedback path 806 couples the output of a final stage to the input of an intermediate stage. In this case, the intermediate stage is the second stage of the n-stage buffer circuit 800. Other stages may provide and receive the feedback in other cases. In this example, both of the feedback paths 802, 806 includes a respective resistor. In the feedback path 806, the resistor may be in series with the inverter circuit, but the configuration or other characteristics of one or more of the feedback paths 802, 804, 806 may vary from the example shown.

Figure 9:
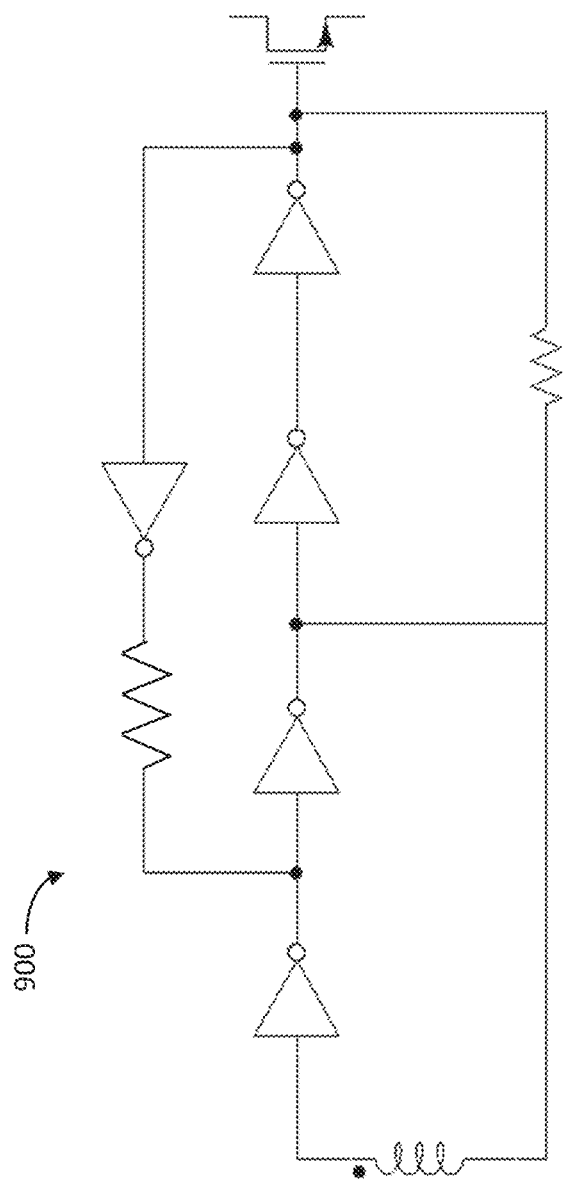
FIG. 9 is a schematic view of a feedback arrangement for use with the disclosed devices, methods and systems in accordance with still another example.

FIG. 9 depicts an n-stage buffer circuit 900 with multiple feedback paths in accordance with one example. In this case, three feedback paths are provided. The feedback paths of the example of FIG. 9 are similar to the example of FIG. 8. The difference is the configuration of a feedback path from a final stage of the buffer circuit. In this case, the feedback path is resistive. In this example, the inverting feedback path includes a resistor in series with the inverter circuit, but the configuration or other characteristics of the feedback path may vary from the example shown.

Figure 10:
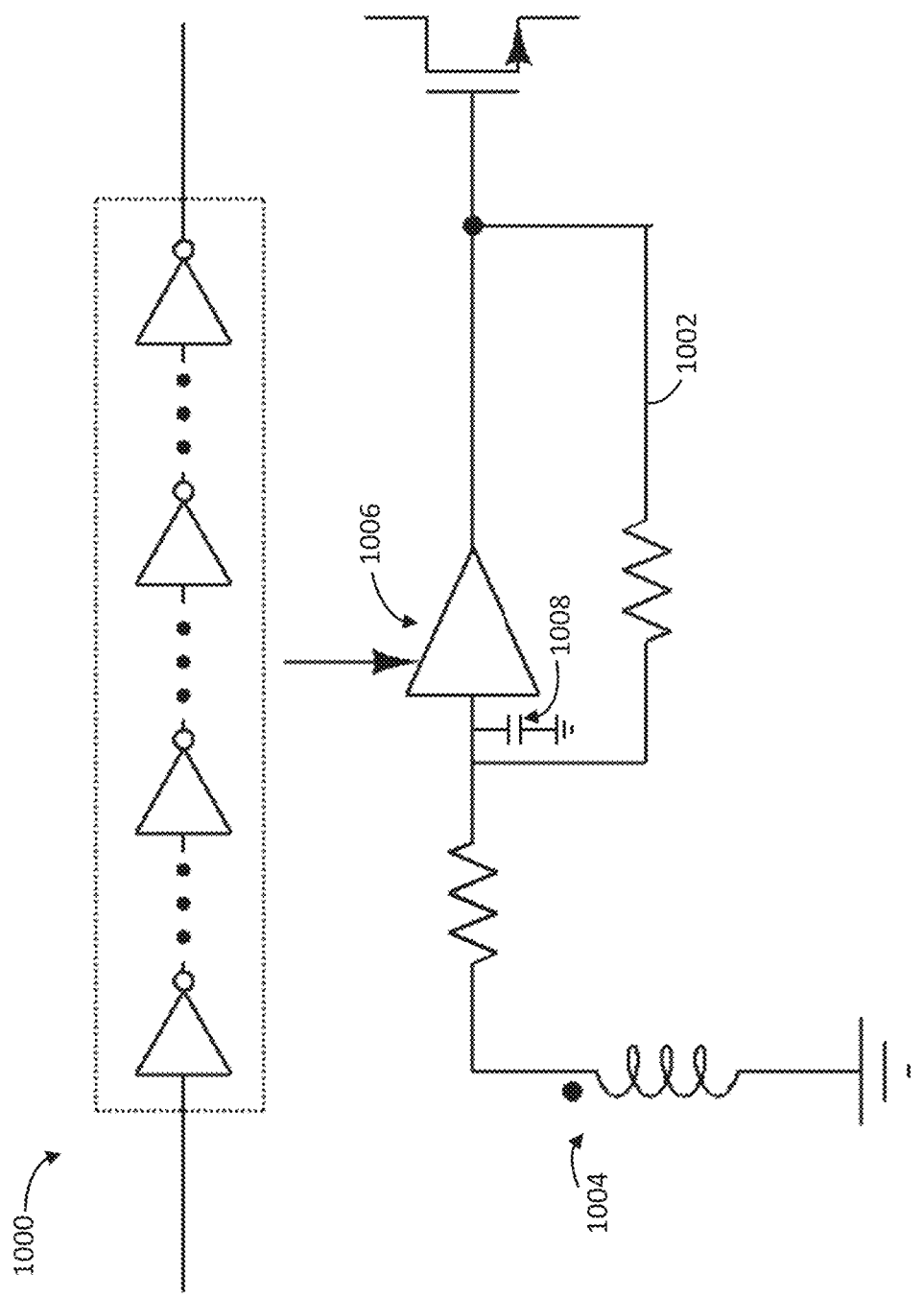
FIG. 10 is a schematic view of a buffer circuit for use with the disclosed devices, methods and systems in accordance with another example.

FIG. 10 depicts a device 1000 with a positive feedback path 1002 in accordance with one example. As with the examples described above, the device 1000 includes a transformer 1004 (partially shown) and an n-stage buffer circuit 1006 coupled to an output winding of the transformer 1004. The device 1000 differs from the above examples in that the positive feedback path 1002 couples a stage of the n-stage buffer circuit 1006 to an input of the n-stage buffer circuit 1006 rather than to the transformer 1004. The positive feedback path 1002 provides a DC offset to the input of the n-stage buffer circuit. The DC offset is provided to the input directly in this case, rather than indirectly through, e.g., the transformer secondary.

The buffer circuit 1006 of the device 1000 presents a parasitic input capacitance 1008 as shown in FIG. 10. The parasitic input capacitance may decrease the speed of the positive feedback and increase the effective propagation delay.

In this case, the feedback path 1002 is coupled to the output of the final stage of the n-stage buffer circuit 1006. Alternative or additional stage outputs may be used in other cases.

The positive feedback path 1002 of the device 1000 also provides an example of a scaling option for the positive feedback. In this case, the scaling is provided via a resistor divider. Alternative or additional types of scaling techniques may be used. The resistor divider or other scaling may be incorporated into any of the examples of feedback paths described herein.

As shown via the examples described above, the nature, number, and other characteristics of the positive feedback paths may vary. From zero to any number of each kind of positive feedback may be provided.

Figure 11:
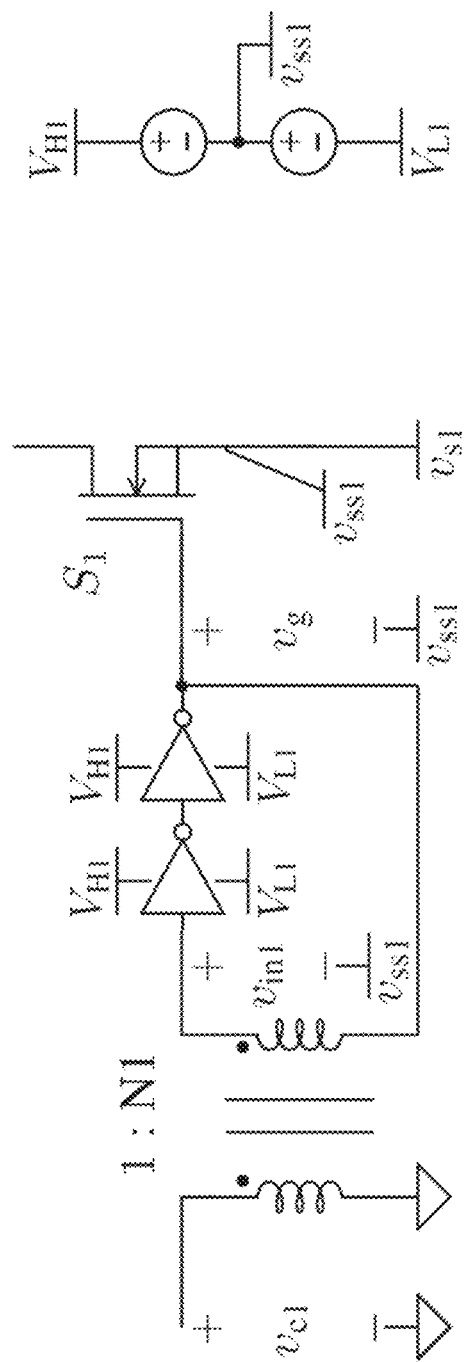
FIG. 11 is a schematic view of a system in which a depletion-mode field-effect transistor is driven by a gate driver in accordance with another example.

FIG. 11 depicts a system for driving a gate of a FET S1 in accordance with one example. In this case, the FET S1 is a depletion-mode FET. As shown by this example, the positive feedback of the disclosed devices may be used in connection with normally on devices such as a depletion-mode FET, and in circumstances in which the drive signal $v_g$ goes negative, i.e., more negative than a negative threshold voltage of the FET S1, to turn off the FET S1. The threshold voltage in this example is between 0 Volts and the negative voltage $V_{L1}$.

Figure 12:
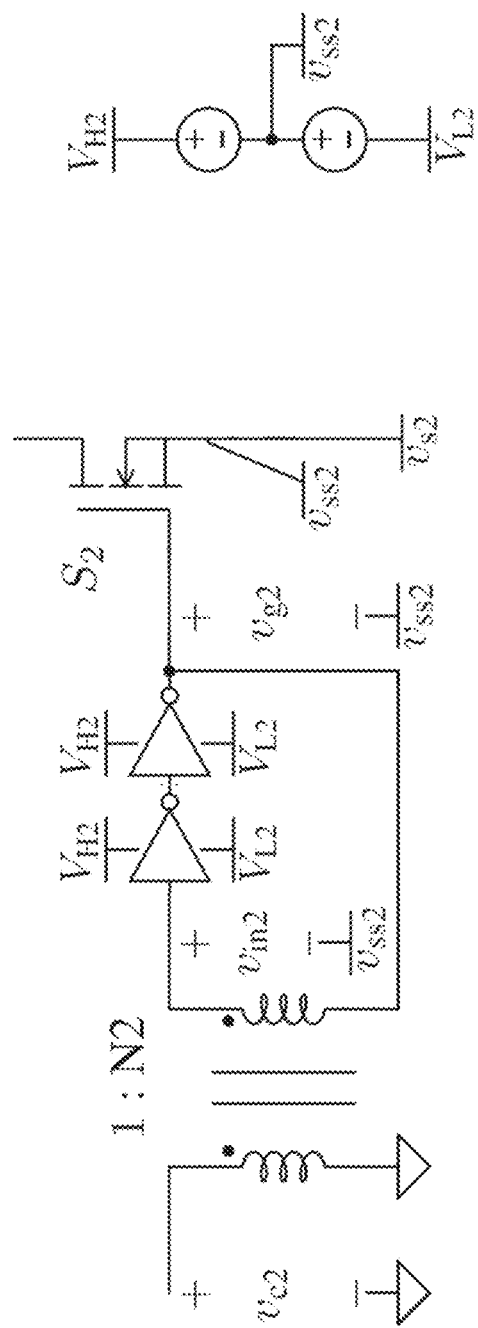
FIG. 12 is a schematic view of a system in which an enhancement-mode field-effect transistor is driven by a gate driver in accordance with another example.

FIG. 12 depicts an example of a system for driving a gate of a type of FET that is normally off. In this example, a FET S2 is an enhancement-mode FET. In this case, the drive signal $v_g$ goes high, i.e., above the threshold voltage of the FET S2, to turn on the FET S2. The threshold voltage in this example is between 0 Volts and the positive voltage $V_{H2}$.

Figure 13:
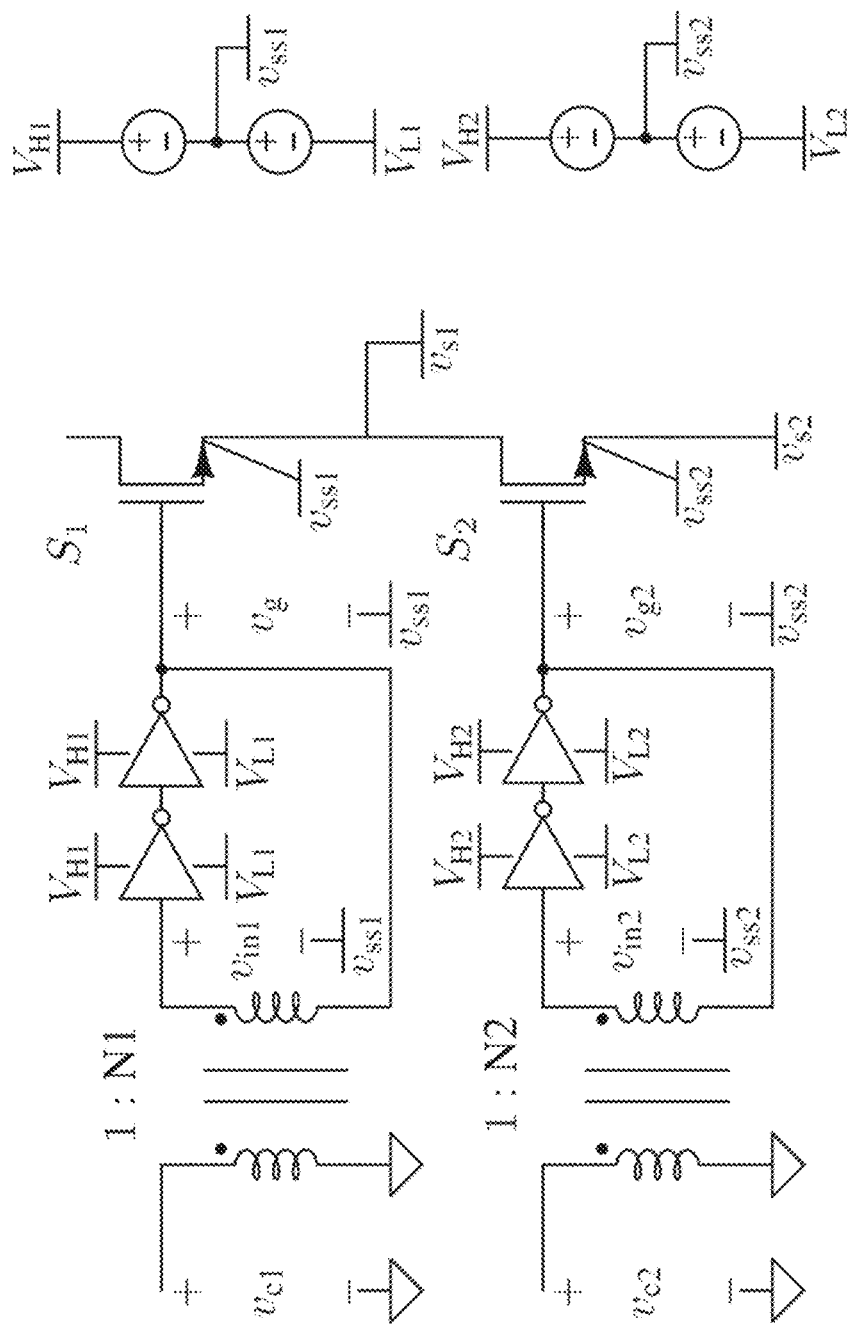
FIG. 13 is a schematic view of a half-bridge system with high-side and low-side transistors driven by gate drivers in accordance with another example.

FIG. 13 depicts a system in which feedback-based gate drivers are deployed in a half-bridge arrangement of two FET devices S1, S2. The FET device S1 is floating relative to ground. The magnetic isolation of the gate drivers allows the control signals to be ground referenced. One or both of the FET devices S1, S2 may be a depletion-mode FET or an enhancement-mode FET. In this example, the voltages $V_{H1}$, $V_{H2}$, $V_{L1}$, and $V_{L2}$ are four isolated power supplies.

Figure 14:
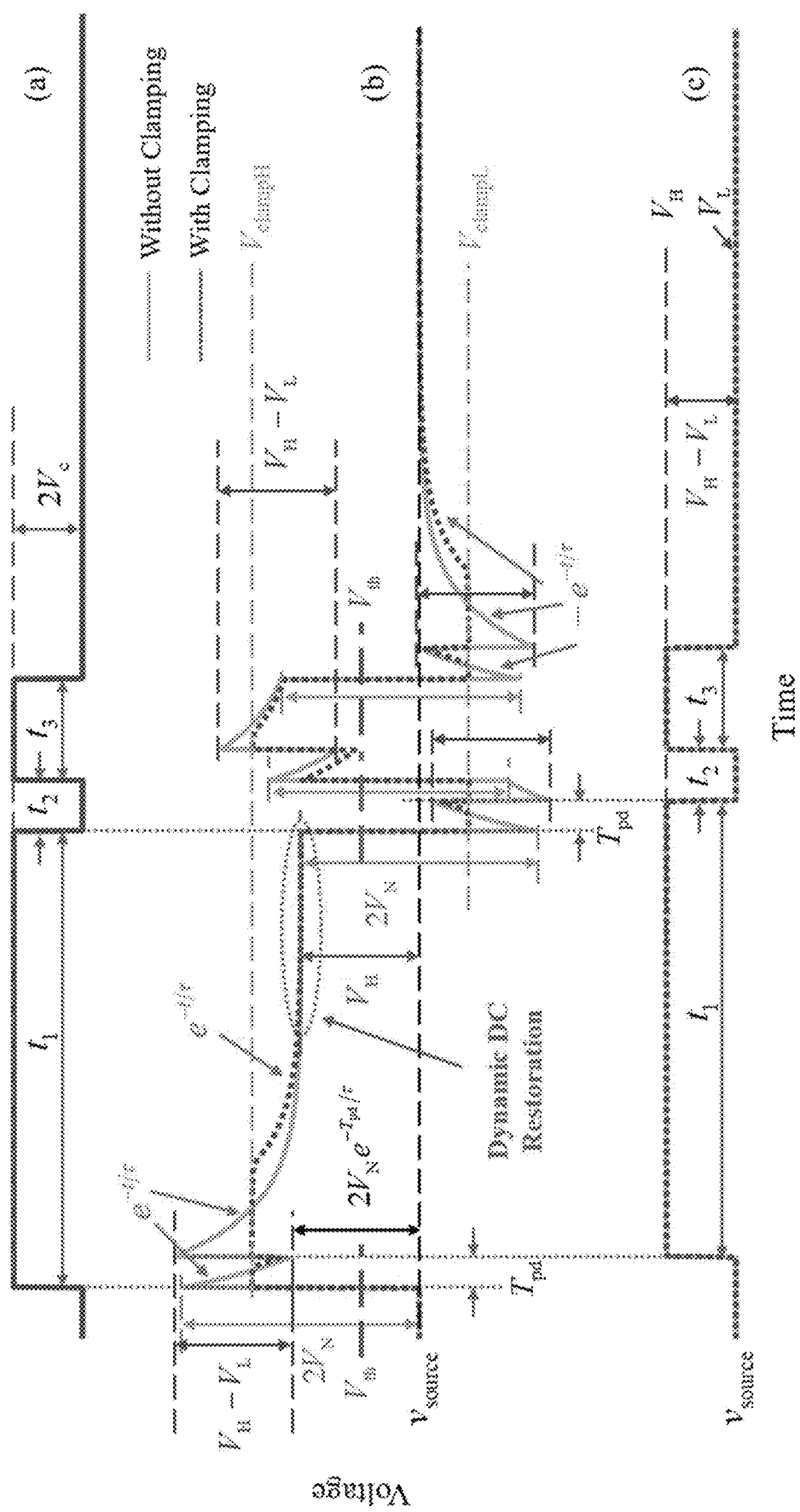
FIG. 14 depicts graphical plots of time-domain diagrams showing operation of the disclosed devices and systems involving a combination of a long pulse and an intermediate duration pulse in accordance with one example.

FIG. 14 depicts time domain diagrams depicting the operation of the disclosed gate driving devices, systems, and methods in accordance with one example. The time domain diagrams illustrate the operation of one of the gate drivers described herein in connection with both a long pulse and a second, short pulse. In this case, the time domain diagrams are provided for (a) reference or control signal $v_{ref}$ (or $v_c$), (b) a logic inverter (or other buffer circuit) input voltage ($v_N$+$v_{gate}$), and (c) a gate driver output voltage $v_{gate}$. The combination of the long and short pulses is similar to the standard double-pulse test to which gate drivers are subjected.

Note that in this example, the voltage $V_L$ is set equal to the source voltage $v_{source}$. The voltage quantities are referenced to the source voltage $v_{source}$.

The input and output voltages of the gate driver are a function of the on-time $T_{on}$, the off-time $T_{off}$, the rise time $t_{rN}$, and the fall time $t_{fN}$. The peak-to-peak values of $v_c$ and $v_N$ are $2V_c$ and $2V_N$, respectively.

As shown in FIG. 14, the dynamic DC restoration provided by the positive feedback establishes a voltage ledge $V_H$ above the threshold $V_{th}$ to ensure a long-pulse output. When the control signal goes low, any variation in the input voltage stays below the threshold voltage to ensure that the gate driver output voltage remains low. Similar variation in the input voltage in response to the short pulse stays above the threshold voltage to ensure that the gate driver output voltage goes and remains high.

The buffer circuit may be configured to present an aggregate propagation delay $T_{pd}$ suitable for both long-pulse operation and short-pulse operation. In short-pulse operation, the upper bound on the aggregate propagation delay may be $$T_{pd} < \min\{T_{on}, T_{off}\} - 0.5 \max\{t_{rg}, t_{fg}\} \qquad (1)$$

where $t_{rg}$ and $t_{fg}$ are the rise and fall times of $v_{gate}$.

The voltage $V_N$ provided via the transformer may be selected to ensure that the levels of the input voltage remain on the correct side of the threshold voltage during transitions. In one example, the transformer may be configured such that the voltage $V_N$ satisfies the following expression.

$$V_N > \frac{T_s}{2(2 \cdot \min\{T_{on}, T_{off}\} + t_{rN} + t_{fN})}(V_H - V_L), \qquad (2)$$

where $t_{rN}$ and $t_{fN}$ are the rise and fall times of $v_N$.

The voltage magnitude $V_c$ may be selected in accordance with the transformer coupling coefficient k and turns ratio N so that $V_c = V_N/kN$.

For compatibility with long pulse operation, the propagation delay may be less than the minimum of the pulse widths. The value of the peak-to-peak open-circuit voltage at the transformer secondary may be as follows:

$$2V_N \geq V_{clampH} - V_{clampL}. \qquad (3)$$

Long-pulse operation may be further supported by configuring the droop time constant $\tau$. The droop time constant, which may be considered a design variable, may be determined by the magnetizing inductance of the transformer and resistance in series with the control signal. The droop time constant may be established or determined by resistors and a DC blocking capacitor. The droop time constant may be established or determined by a combination of a number of resistors, capacitors, and transformer inductances. The maximum value of $\tau$ may be determined by the minimum possible $t_1$ and $t_2$ (see, e.g., FIG. 14) and any limitations on $T_{pd}$ and $V_{th}$, but may be adjusted by choice of logic levels $V_H$ and $V_L$, and clamp voltages $V_{clampH}$ and $V_{clampL}$ via, e.g., the configuration of the buffer circuit components, as follows:

$$\tau > \qquad (4)$$
$$\min\left\{\frac{V_{clampH} - V_H}{V_H - V_{th}}t_1 + \frac{V_H - V_L}{V_H - V_{th}}T_{pd}, \frac{V_L - V_{clampL}}{V_{th} - V_L}t_2 + \frac{V_H - V_L}{V_{th} - V_L}T_{pd}\right\}$$

The minimum value of $\tau$ may be determined via component configurations and voltage levels as follows:

$$\tau > \max\left\{\frac{T_{pd}}{\ln\left(\frac{V_{clampH} - V_L}{V_{th} - V_L}\right)}, \frac{T_{pd}}{\ln\left(\frac{V_H - V_{clampL}}{V_H - V_{th}}\right)}\right\} \qquad (5)$$

Equations (4) and (5) may be combined to calculate lower bounds on $t_1$ and $t_2$ that may supersede the limit from expression (1) as follows.

$$t_1 > \frac{V_H - V_{th}}{V_{clampH} - V_H} T_{pd} \times \left[\frac{1}{\ln\left(\frac{V_{clampH} - V_L}{V_{th} - V_L}\right)} - \frac{V_H - V_L}{V_H - V_{th}}\right] \qquad (6)$$

$$t_2 > \frac{V_{th} - V_L}{V_L - V_{clampL}} T_{pd} \times \left[\frac{1}{\ln\left(\frac{V_H - V_{clampL}}{V_H - V_{th}}\right)} - \frac{V_H - V_L}{V_{th} - V_L}\right] \qquad (7)$$

Together, the expressions (1) and (3)-(7) may be used to support the operation in combined long-pulse and short-pulse regimes as exemplified by FIG. 14.

If t1 is a long pulse, which means the current in the transformer primary converges to Vref/R, then $t_2$ may be such that the transformer has sufficiently reset before the leading edge of $t_3$ so that the logic inverter input voltage reaches the threshold $V_{th}$ on this edge. The parameter $\tau$ may also be considered as the transformer reset time constant.

Expression (5) ensures that the input voltage logic inverter remains correctly asserted after the reference signal assertion at the leading edge of $t_2$ through the duration of the propagation delay $T_{pd}$ so that the positive feedback affirmatively returns the valid value asserted by the reference (control) signal. Similarly, the additive term in equation (4), which involves $T_{pd}$, is derived from the fact that the input voltage to the logic inverter, after the reference signal assertion at the leading edge of $t_3$, remains correctly asserted above the threshold voltage $V_{th}$ at the logic inverter input through the duration of the propagation delay $T_{pd}$ so that the positive feedback affirmatively returns the valid value asserted by the reference signal. The behavior of all subsequent pulses may be inferred from this same analysis.

Figure 15:
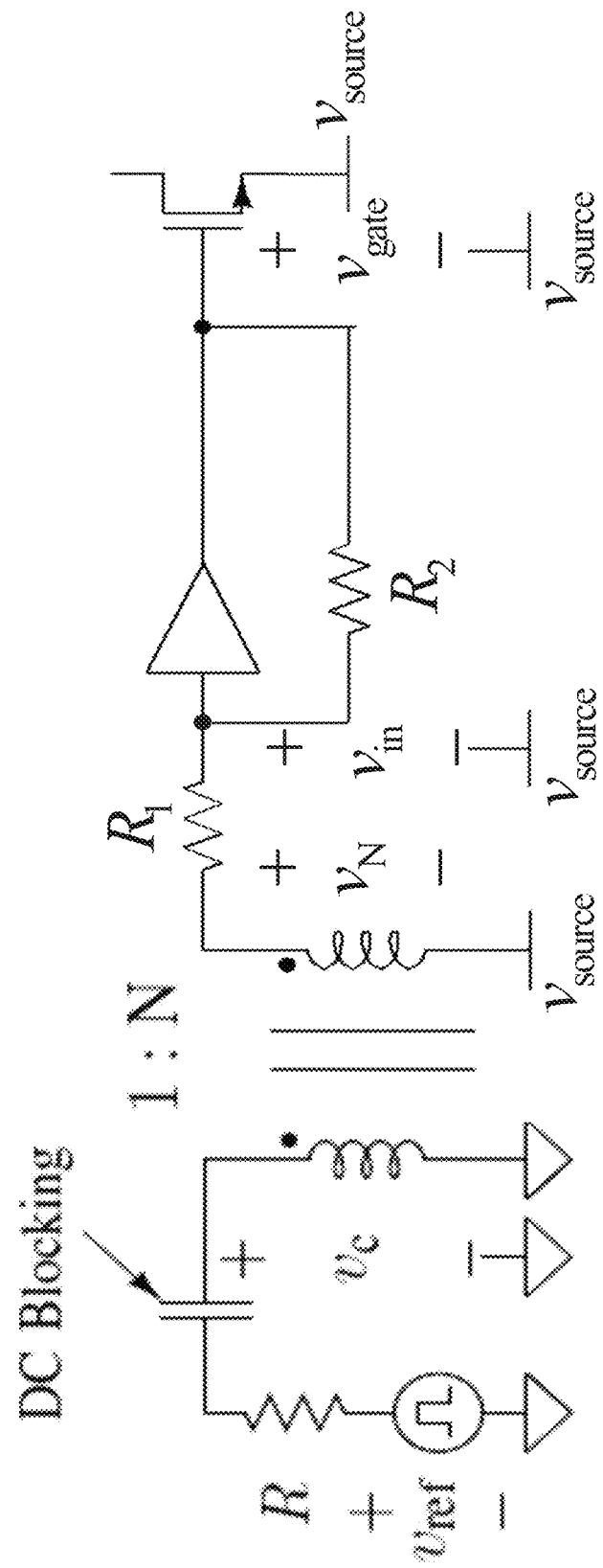
FIG. 15 is a schematic view of a gate driver having feedback with voltage scaling in accordance with one example.

FIG. 15 depicts a gate driver having voltage scaling in the feedback path. In this example, the voltage scaling is provided by a resistor divider arrangement. Other arrangements may be used. In long pulse operation, when the voltage $v_N$ droops to zero, for hold states in which $v_{gate} = V_H$, then the voltage scaling is as follows:

$$v_{in} = \frac{R_1}{R_1 + R_2} v_{gate} = \frac{R_1}{R_1 + R_2} V_H > V_{th} = \frac{1}{2}(V_H + V_L)$$

When $v_{gate} = V_L$, the following expression applies.

$$v_{in} = \frac{R_1}{R_1 + R_2} V_L + \frac{R_2}{R_1 + R_2} v_N > V_{th} = \frac{1}{2}(V_H + V_L)$$

In this example, if $V_L = 0$, then $R_1 > R_2$ and $v_N > V_H$.

Figure 16:
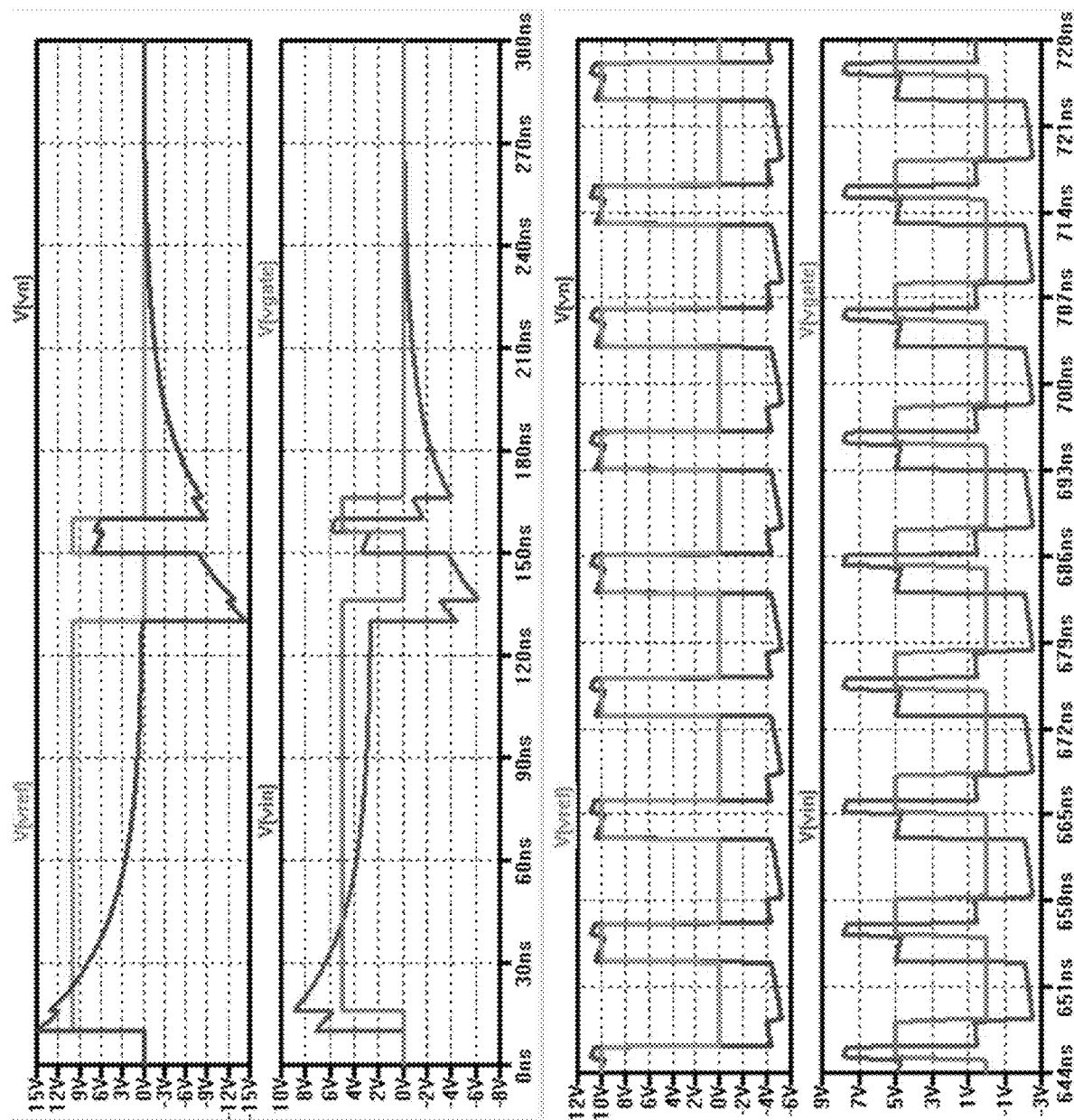
FIG. 16 depicts graphical plots of time-domain diagrams showing long pulse and 30% duty cycle operation of the gate driver of FIG. 15.

In periodic, short pulse operation, because $v_{gate}$ and $v_N$ each have multiple (e.g., two) voltage levels, $v_{in}$ has, e.g., four voltage levels (see, e.g., FIG. 16). As described above, the two ledges cross the threshold voltage $V_{th}$.

Examples of long pulse operation and operation at a 30% duty cycle and 100 MHz are shown in FIG. 16.

The above-described dynamic DC restoration using positive feedback eases the signal transformer design requirements because of droop tolerance and potentially improves isolation. Droop tolerance allows lower magnetizing inductance within the limits described above. Together with fewer required turns, intra-winding (turn-to-turn) capacitance is decreased and higher self-resonant frequency is possible.

Leakage inductance trades off with interwinding (primary-secondary coupling) capacitance. For example, bifilar windings have low leakage inductance, but high interwinding capacitance, whereas 180° sector windings have the opposite; a sector wound transformer can be used to trade off leakage inductance with interwinding capacitance in this case.

The above-described dynamic DC restoration prevents droop from encroaching on the logic inverter input noise margins by maintaining a valid input state. This enables better tolerance to ringing and thus may allow higher leakage inductance, which subsequently can mean lower interwinding/coupling capacitance.

The ultrafast gate drivers and other devices, systems, and methods described above achieve gate voltage slew rates above 12 GV/s with rise and fall times below 260 ps. Magnetic isolation provides transient immunity and positive feedback enables dynamic DC restoration to preserve variable duty cycles and allow arbitrarily long on- or off-times.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A device for driving a control terminal of a transistor, the device comprising:
    an input terminal;
    a transformer comprising an input winding and an output winding, the input winding being coupled to the input terminal;
    an n-stage buffer circuit configured to generate a drive signal for the control terminal of the transistor, the n-stage buffer circuit being coupled to a first end of the output winding; and
    a positive feedback path coupled to an output of a stage of the n-stage buffer circuit to provide a DC offset to an input of the n-stage buffer circuit.

2. The device of claim 1, wherein the positive feedback path is coupled to a second end of the output winding such that the DC offset is provided via the output winding.

3. The device of claim 2, wherein the positive feedback path establishes a DC offset voltage for the output winding of the transformer at the second end of the output winding.

4. The device of claim 1, wherein the positive feedback path is configured to provide direct feedback.

5. The device of claim 1, wherein the positive feedback path is configured to provide resistive feedback.

6. The device of claim 1, further comprising a further positive feedback path between two stages of the n-stage buffer circuit.

7. The device of claim 1, further comprising a resistive feedback path within the n-stage buffer circuit, the resistive feedback path comprising an inverter circuit.

8. The device of claim 1, further comprising a non-inverting feedback path within the n-stage buffer circuit.

9. The device of claim 1, further comprising a further positive feedback path coupling a further stage output of the n-stage buffer circuit to the second end of the output winding.

10. The device of claim 1, wherein each stage of the n-stage buffer circuit comprises an inverter circuit.

11. The device of claim 10, wherein each inverter circuit of the pair of inverter circuits comprises a series of cascaded inverters.

12. The device of claim 1, wherein at least one stage of the n-stage buffer circuit comprises a parallel arrangement of buffer devices.

13. The device of claim 1, wherein:
    a first stage of the n-stage buffer circuit comprises a first number of parallel buffer devices;
    a second stage of the n-stage buffer circuit has a second number of parallel buffer devices, the second stage following the first stage; and
    the second number is greater than the first number.

14. The device of claim 1, wherein:
    a first stage of the n-stage buffer circuit comprises a buffer device having a first size;
    a second stage of the n-stage buffer circuit comprises a buffer device having a second size, the second stage following the first stage; and
    the second size is larger than the first size.

15. The device of claim 1, wherein the stage of the n-stage buffer circuit coupled by the positive feedback path to the second end of the output winding is an intermediate stage of the n-stage buffer circuit.

16. The device of claim 1, wherein the stage of the n-stage buffer circuit coupled by the positive feedback path to the second end of the output winding is a final stage of the n-stage buffer circuit.

17. The device of claim 1, wherein the n-stage buffer circuit is configured as a single-stage buffer.

18. The device of claim 1, wherein the drive signal is a current signal.

19. The device of claim 1, wherein the drive signal is a voltage signal.

20. A method for driving a control terminal of a transistor, the method comprising:
    receiving a control signal;
    magnetically coupling, via a transformer, the control signal to an n-stage buffer circuit;
    generating, via the n-stage buffer circuit, a drive signal for the control terminal of the transistor; and
    providing positive feedback from an output of a stage of the n-stage buffer circuit to establish a DC offset voltage of the transformer.

21. The method of claim 20, wherein generating the drive signal comprises, in a respective stage of the n-stage buffer circuit:
    inverting an input signal to the respective stage; and
    inverting the inverted input signal.

22. The method of claim 20, wherein generating the drive signal comprises generating two voltages that are differential.

23. The method of claim 20, wherein generating the drive signal comprises increasing a current drive of the drive signal via processing by successive stages of the n-stage buffer circuit.

24. The method of claim 20, wherein providing the positive feedback comprises providing an output of an intermediate stage of the n-stage buffer circuit.

25. The method of claim 20, wherein providing the positive feedback comprises providing, from an output of a further stage of the n-stage buffer circuit, further feedback to establish the DC offset voltage of the transformer.

26. The method of claim 20, wherein providing the positive feedback comprises providing further positive feedback between two stages of the n-stage buffer circuit.

27. A method for driving a control terminal of a transistor, the method comprising:
   receiving a control signal;
   magnetically coupling, via a transformer, the control signal to an n-stage buffer circuit;
   generating, via the n-stage buffer circuit, a drive signal for the control terminal of the transistor; and
   providing positive feedback from an output of a stage of the n-stage buffer circuit such that a level of an output of the n-stage buffer circuit is maintained as long as the control signal remains constant.

28. A system comprising:
   a transistor having a gate; and
   a gate driver configured to generate a gate drive signal, the gate driver being coupled to the gate;
   wherein the gate driver comprises:
      an input terminal;
      a transformer comprising an input winding and an output winding, the input winding being coupled to the input terminal;
      an n-stage buffer circuit configured to generate the gate drive signal, the n-stage buffer circuit being coupled to a first end of the output winding; and
      a positive feedback path coupling an output of a stage of the n-stage buffer circuit to a second end of the output winding.

* * * * *